(12) United States Patent
Matthews et al.

(10) Patent No.: US 9,390,906 B1
(45) Date of Patent: Jul. 12, 2016

(54) METHOD FOR CREATING ASYMMETRICAL WAFER

(71) Applicant: Rubicon Technology, Inc., Bensenville, IL (US)

(72) Inventors: Michael W. Matthews, Bonn (DE); Sunil B. Phatak, Bensenville, IL (US)

(73) Assignee: Rubicon Technology, Inc., Bensenville, IL (US)

( * ) Notice: Subject to any disclaimer, the term of this patent is extended or adjusted under 35 U.S.C. 154(b) by 106 days.

(21) Appl. No.: 14/073,602

(22) Filed: Nov. 6, 2013

Related U.S. Application Data

(60) Continuation of application No. 13/757,284, filed on Feb. 1, 2013, now Pat. No. 8,623,136, which is a division of application No. 11/756,899, filed on Jun. 1, 2007, now Pat. No. 8,389,099.

(51) Int. Cl.
*H01L 29/04* (2006.01)
*H01L 21/02* (2006.01)

(52) U.S. Cl.
CPC .... *H01L 21/02035* (2013.01); *H01L 21/02013* (2013.01); *H01L 21/02021* (2013.01); *H01L 21/02024* (2013.01)

(58) Field of Classification Search
CPC ...................................................... G01B 11/026
USPC ............................................ 257/49; 356/614
See application file for complete search history.

(56) References Cited

U.S. PATENT DOCUMENTS

| | | |
|---|---|---|
| 3,912,521 A | 10/1975 | Cline |
| 3,915,661 A | 10/1975 | Vichr |
| 4,000,019 A | 12/1976 | Van Den Brekel |
| 4,190,631 A | 2/1980 | Dewees |
| 4,231,838 A | 11/1980 | Gier |
| 4,246,064 A | 1/1981 | Dewees |
| 4,260,525 A | 4/1981 | Olsen |
| 4,390,513 A | 6/1983 | Fujiki |
| 4,585,716 A | 4/1986 | Chalilpoyil |
| 4,630,093 A | 12/1986 | Yamaguchi et al. |
| 4,632,884 A | 12/1986 | Shikatani et al. |
| 4,746,396 A | 5/1988 | Marnier |
| 4,761,202 A | 8/1988 | Bourdui |
| 4,783,225 A | 11/1988 | Maejima et al. |
| 4,861,418 A | 8/1989 | Nishimura et al. |
| 4,921,834 A | 5/1990 | Hasegawa |
| 4,961,819 A | 10/1990 | Marnier |
| 4,997,515 A | 3/1991 | Ohbayashi |
| 5,006,199 A | 4/1991 | Kishimoto |
| 5,021,862 A | 6/1991 | Ogino |
| 5,045,505 A | 9/1991 | Kimura |
| 5,060,043 A | 10/1991 | Yasue |
| 5,084,206 A | 1/1992 | Ballman |
| 5,110,764 A | 5/1992 | Ogino |
| 5,147,824 A | 9/1992 | Yasue |

(Continued)

*Primary Examiner* — Brent O'Hern
(74) *Attorney, Agent, or Firm* — Sunstein Kann Murphy & Timbers LLP

(57) ABSTRACT

The present invention consists of a method for imparting asymmetry to a truncated annular wafer by either rounding one corner of the orientation flat, or rounding one corner of a notch. This novel method of rounding corners impart a visual and/or tactile asymmetry which can be utilized by a person in order to differentiate between the two different sides of the wafer. This inventive wafer design and method for making an asymmetric wafer is especially useful in the field of semiconductor technology and may be used on sapphire crystal wafers or any other class of wafer.

11 Claims, 9 Drawing Sheets

(56) References Cited

U.S. PATENT DOCUMENTS

| | | |
|---|---|---|
| 5,174,067 A | 12/1992 | Hasegawa |
| 5,182,233 A | 1/1993 | Inoue |
| 5,230,747 A | 7/1993 | Maejima et al. |
| 5,279,992 A | 1/1994 | Maejima et al. |
| 5,322,588 A | 6/1994 | Habu |
| 5,326,423 A | 7/1994 | Ballman |
| 5,333,413 A | 8/1994 | Hashimoto |
| 5,334,365 A | 8/1994 | Cheng |
| 5,359,452 A | 10/1994 | Nitanda |
| 5,361,545 A | 11/1994 | Nakamura |
| 5,370,076 A | 12/1994 | Okamoto |
| 5,394,825 A | 3/1995 | Schmid |
| 5,411,723 A | 5/1995 | Morris |
| 5,439,723 A | 8/1995 | Miyashita et al. |
| 5,474,022 A | 12/1995 | Abe |
| 5,580,831 A | 12/1996 | Roman |
| 5,593,496 A | 1/1997 | Shcranz |
| 5,647,789 A | 7/1997 | Kitta |
| 5,697,832 A | 12/1997 | Greenlaw |
| 5,714,004 A | 2/1998 | Okuno |
| 5,720,809 A | 2/1998 | Lino |
| 5,733,175 A | 3/1998 | Leach |
| 5,751,055 A | 5/1998 | Maruyama et al. |
| 5,762,537 A | 6/1998 | Sandhu |
| 5,788,764 A | 8/1998 | Sato |
| 5,800,906 A | 9/1998 | Lee et al. |
| 5,876,819 A | 3/1999 | Kimura et al. |
| 5,879,590 A | 3/1999 | Blom |
| 5,951,380 A | 9/1999 | Kim |
| 5,956,596 A | 9/1999 | Jang et al. |
| 5,982,044 A | 11/1999 | Lin et al. |
| 5,993,292 A | 11/1999 | Oishi et al. |
| 6,004,193 A | 12/1999 | Nagahara |
| 6,004,405 A | 12/1999 | Oishi et al. |
| 6,054,017 A | 4/2000 | Yang |
| 6,074,277 A | 6/2000 | Arai |
| 6,080,048 A | 6/2000 | Kotagiri |
| 6,086,457 A | 7/2000 | Perlov |
| 6,120,347 A | 9/2000 | Sandhu |
| 6,120,352 A | 9/2000 | Duescher |
| 6,149,506 A | 11/2000 | Duescher |
| 6,152,806 A | 11/2000 | Nystrom |
| 6,168,684 B1 | 1/2001 | Mitsuhashi |
| 6,177,285 B1 | 1/2001 | Jantke et al. |
| 6,235,637 B1 | 5/2001 | Chen et al. |
| 6,261,918 B1 | 7/2001 | So |
| 6,296,784 B1 | 10/2001 | Sasaki |
| 6,302,769 B1 | 10/2001 | Nishi et al. |
| 6,338,667 B2 | 1/2002 | Sandhu |
| 6,346,036 B1 | 2/2002 | Halley |
| 6,375,550 B1 | 4/2002 | Berman |
| 6,410,927 B1 | 6/2002 | Pike |
| 6,432,823 B1 | 8/2002 | Huynh |
| 6,537,135 B1 | 3/2003 | Easter |
| 6,575,825 B2 | 6/2003 | Tolles |
| 6,627,552 B1 | 9/2003 | Nishio |
| 6,629,874 B1 | 10/2003 | Halley |
| 6,632,127 B1 | 10/2003 | Zimmer |
| 6,672,943 B2 | 1/2004 | Vogtmann |
| 6,702,657 B2 | 3/2004 | Ficarro |
| 6,740,542 B2 | 5/2004 | Witvrouw et al. |
| 6,769,969 B1 | 8/2004 | Duescher |
| 6,777,820 B2 | 8/2004 | Chiba et al. |
| 6,793,565 B1 | 9/2004 | Chadda |
| 6,821,337 B2 | 11/2004 | Bawendi |
| 6,843,849 B1 | 1/2005 | Sasaki |
| 6,855,030 B2 | 2/2005 | Halley |
| 6,864,534 B2 | 3/2005 | Ipposhi et al. |
| 6,869,861 B1 | 3/2005 | Glenn et al. |
| 6,897,126 B2 | 5/2005 | Asano et al. |
| 6,909,165 B2 | 6/2005 | Nakayama et al. |
| 6,967,416 B2 | 11/2005 | Arai |
| 7,004,822 B2 | 2/2006 | Maloney |
| 7,014,707 B2 | 3/2006 | Amemiya |
| 7,057,259 B2 | 6/2006 | Arikado et al. |
| 7,063,741 B2 | 6/2006 | D'Evelyn |
| 7,081,038 B2 | 7/2006 | Ina |
| 7,081,162 B2 | 7/2006 | Dwilinski |
| 7,094,441 B2 | 8/2006 | Chittibabu |
| 7,101,431 B2 | 9/2006 | Miner |
| 7,102,206 B2 | 9/2006 | Hidaka et al. |
| 7,104,871 B1 | 9/2006 | Kennedy |
| 7,166,016 B1 | 1/2007 | Chen |
| RE39,484 E | 2/2007 | Bruel |
| 7,172,493 B2 | 2/2007 | Novak |
| 7,183,178 B2 | 2/2007 | Arai |
| 7,186,165 B2 | 3/2007 | Jeong |
| 7,258,743 B2 | 8/2007 | Fournel et al. |
| 2001/0001077 A1 | 5/2001 | Tan et al. |
| 2001/0008154 A1* | 7/2001 | Guldi et al. ............ B24B 9/065 148/33.2 |
| 2001/0029158 A1 | 10/2001 | Sasaki |
| 2001/0033033 A1 | 10/2001 | Yao et al. |
| 2001/0038153 A1 | 11/2001 | Sakaguchi et al. |
| 2001/0048142 A1 | 12/2001 | Urakami et al. |
| 2002/0049029 A1 | 4/2002 | Large |
| 2002/0153620 A1 | 10/2002 | Guldi et al. |
| 2002/0185055 A1 | 12/2002 | Oka |
| 2003/0003608 A1 | 1/2003 | Arikado et al. |
| 2003/0032299 A1 | 2/2003 | Ouellet |
| 2003/0102576 A1 | 6/2003 | Teramoto |
| 2003/0164534 A1 | 9/2003 | Urakami et al. |
| 2003/0175531 A1 | 9/2003 | Fournel et al. |
| 2004/0089958 A1 | 5/2004 | Arai et al. |
| 2004/0097084 A1 | 5/2004 | Fukuda et al. |
| 2004/0104361 A1 | 6/2004 | Guldi |
| 2004/0112277 A1 | 6/2004 | Kulkarni |
| 2004/0124502 A1 | 7/2004 | Choi et al. |
| 2004/0246795 A1 | 12/2004 | Tomita |
| 2004/0262783 A1 | 12/2004 | Ido et al. |
| 2005/0070068 A1 | 3/2005 | Kobayashi |
| 2005/0109263 A9 | 5/2005 | Chiang et al. |
| 2005/0118781 A1 | 6/2005 | Berge et al. |
| 2005/0194738 A1 | 9/2005 | Simmons |
| 2005/0280121 A1 | 12/2005 | Doris et al. |
| 2006/0030157 A1 | 2/2006 | Ivanov |
| 2006/0032428 A1 | 2/2006 | Dwilinski |
| 2006/0037529 A1 | 2/2006 | D'Evelyn |
| 2006/0105680 A1 | 5/2006 | Jeong |
| 2006/0118920 A1 | 6/2006 | Subramanian et al. |
| 2007/0031743 A1 | 2/2007 | Bijnen et al. |
| 2007/0049179 A1 | 3/2007 | Chandrasekaran |

\* cited by examiner

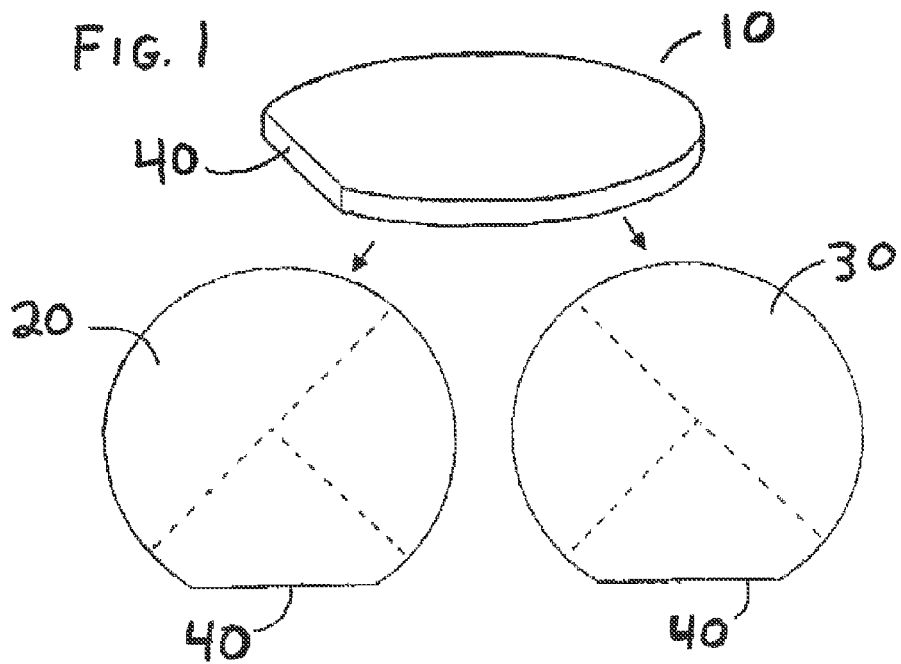
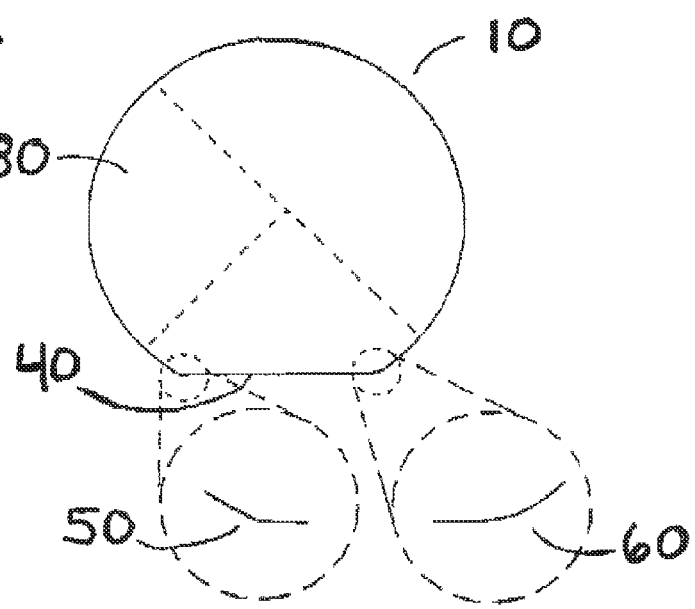

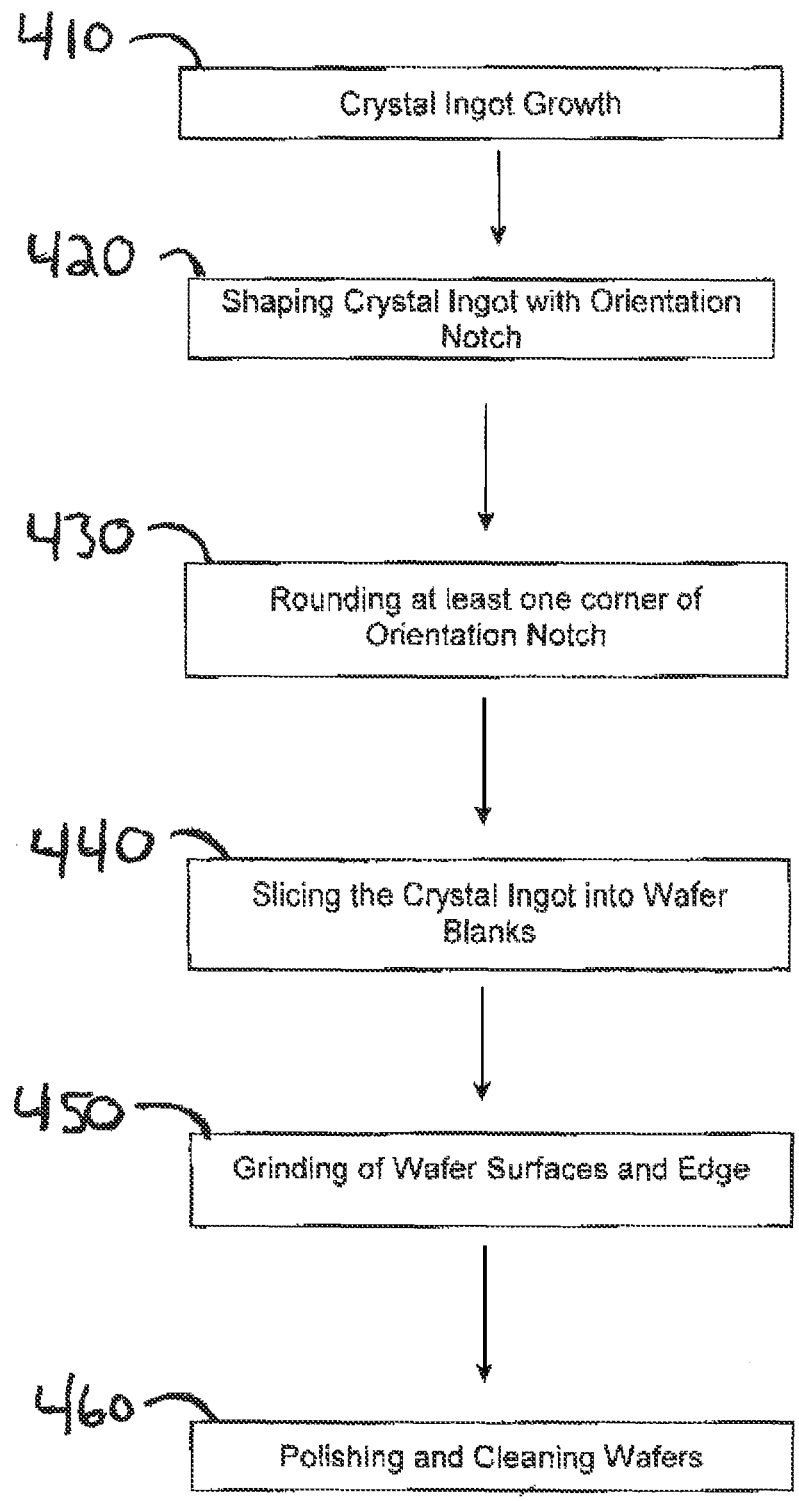

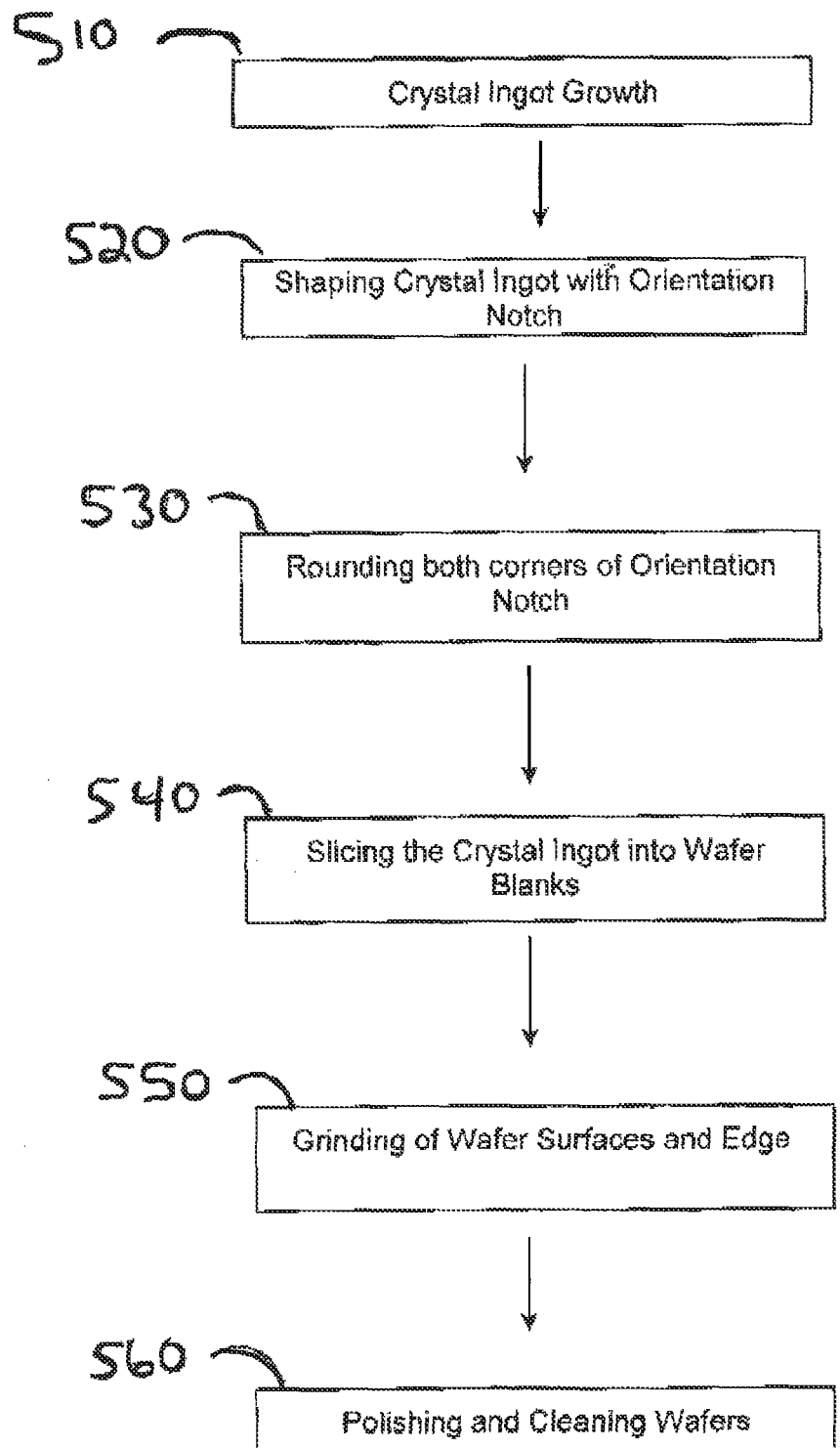

METHOD FOR CREATING ASYMMETRICAL WAFER

CROSS-REFERENCE TO RELATED APPLICATIONS

The present application is a continuation application of U.S. patent application Ser. No. 13/757,284, filed on Feb. 1, 2013, titled "Asymmetrical Wafer Configurations and Method for Creating the Same" and naming Michael W. Matthews and Sunil B. Phatak as inventors, which issued as U.S. Pat. No. 8,623,136 on Jan. 7, 2014, which is a divisional application of U.S. patent application Ser. No. 11/756,899, filed on Jun. 1, 2007, titled "Asymmetrical Wafer Configurations and Method for Creating the Same" and naming Michael W. Matthews and Sunil B. Phatak as inventors, which issued as U.S. Pat. No. 8,389,099 on Mar. 5, 2013, the full disclosures of which are hereby incorporated by reference.

FIELD OF THE INVENTION

The present invention relates to the field of semiconductor and sapphire wafers which are used to create electronic and optoelectronic devices. More particularly, the present invention relates to inventive methods for physically designing configurations for the wafers in order to create visual and tactile asymmetry which identifies the orientation of the crystals within the wafer.

BACKGROUND OF THE INVENTION

Crystal symmetry in sapphire and many other single crystal systems in the past could not be determined by the unaided eye. In certain situations, crystal symmetry considerations result in anisotropic behavior of the crystal structure necessitating specific crystalline orientations be maintained in reference to the overall geometry of the end device or part. Currently, there are available a wide variety of methods to mark a wafer made of semiconductor, sapphire, or other materials. In reviewing the prior art, several different methods of marking wafers to determine the crystalline orientation were disclosed. These methods include: using various orientation flats and notches, marking the surface of the wafer with an identifying mark using a laser beam, marking a beveled edge portion with a bar code, adding a beveled portion which aids differentiating between the top and bottom, removing the corner of a rectangular wafer, and utilizing systems having a notch and a hole to align a wafer.

A number of methods discuss altering the wafers with various types of marks. The Guldi U.S. Pat. App. Pub. No. 2002/0153620 discloses a system of marking either the surface or bevel edge of a semiconductor with a laser to form a marking such as a two-dimensional bar code along the wafer edge at specified angular positions. The Choi U.S. Pat. App. Pub. No. 2004/0124502 discloses a semiconductor wafer having a marking region on a lower side surface of a convex edge of the wafer wherein the marking may be carved by a laser. The Yamaguchi U.S. Pat. No. 4,630,093 discloses adding asymmetry to semiconductor wafers belonging to groups III-V having crystalline structure of the zinc blend type by providing asymmetry on the peripheral edge with regard to the middle plane. The disclosure further explains that when a wafer is etched, the etching process is either slowed down or sped up according to whether the surface is mesa or reverse mesa. The Arikodo U.S. Pub. No. 2004/003608 discloses a semiconductor wafer having a beveled contour on its outer periphery and an ID mark is provided on the beveled contour. The Sakaguchi U.S. Pat. Pub. No. 2001/0038153 discloses the use of a wafer having a semiconductor layer which forms a supporting substrate and an insulating layer therebetween whereby a mark is formed in an area other than upon the semiconductor layer.

The Tan U.S. Pat. Pub. No. 2001/0001077 discloses a method for producing an alignment mark on only the oxide or BPSG layer of a wafer. The Arai U.S. Pat. Pub. No. 2004/0089958 discloses a semiconductor wafer having an ID mark formed consisting of a bar code or the like which is positioned on the interior of a base plate. The Guldi U.S. Pat. Pub. No. 2002/0153620 discloses a marking for semiconductor wafers which includes information such as a 2D bar code that is marked with a laser on several locations on the wafer so that these edge markings may be used for visual orientation.

The Shikatani U.S. Pat. No. 4,632,884 discloses a rectangular semiconductor wafer having either a corner cut off or a V-shaped groove located along its edge to identify the front and back sides of the wafer. The Nakayama U.S. Pat. No. 6,909,165 B2 discloses a rectangular nitride semiconductor wafer which has a longer slanting edge and a shorter slanting edge at neighboring corners. The Yasue U.S. Pat. No. 5,060,043 discloses a semiconductor wafer having angular perimeter notching to disclose crystal orientation. The notches are small so that they may be formed on the bar member prior to slicing. The Yasue U.S. Pat. No. 5,147,824 discloses a method of manufacturing a wafer having angular notches to disclose crystal orientation.

The Kimura U.S. Pat. No. 5,876,819 discloses the use of a semicircular contour which is utilized as a mark for detecting orientation of the wafer in lieu of a traditional semicircular cut out. This decreases both strength and uniformity of thickness in the area of the cutout. The Lee U.S. Pat. No. 5,800,906 discloses a wafer label which includes concave marks formed on the edge of a flat zone of the wafer via use of photolithography or laser etching in a conventional manner. The Miyashito U.S. Pat. No. 5,439,723 discloses a semiconductor wafer which uses an angular notch and an aperture to achieve precision alignment along an orientation flat.

The Jang U.S. Pat. No. 5,956,596 discloses a round semiconductor wafer having a flat zone and a rectangular bar code region for marking wafers. The Oishi U.S. Pat. No. 5,993,292 discloses a method of producing a wafer without a notch that has a mark oriented to a notch provided earlier during processing. Similarly, the Oishi U.S. Pat. No. 6,004,405 discloses a wafer having laser marks carved as a bar code upon a chamfered edge. The Jantke U.S. Pat. No. 6,177,285 B1 discloses a method for determining crystal orientation by finding the distance between adjacent mask openings having a double T-shape. This method allows orientation to be determined even by the naked eye.

The Chen U.S. Pat. No. 6,235,637 B1 discloses a method of marking a semiconductor layer using laser scribing which will not induce flat edge particle yield reduction or edge defects. The Ipposhi U.S. Pat. No. 6,864,534 B1 discloses two types of semiconductor wafers having a notch or an orientation flat. The Arai U.S. Pat No. 7,183,178 discloses a wafer support surface having a crystal orientation angular notch provided along its outer periphery wherein the orientation of a wafer may be determined even when its outer edge has been chipped. The Arikado U.S. Pat. No. 7,057,259 B2 discloses a semiconductor wafer having a bevel contour and an ID mark formed on the bevel contour. (See the Arikado disclosure, infra). The Hidaka U.S. Pat. No. 7,102,206 B2 discloses a semiconductor wafer with a substrate and a method for producing that semiconductor wherein the semiconductor has a notch and a curved portion wherein the difference in curvature between the two shoulder portions on the notice is between 0.0 mm and 0.1 mm.

Still other patents disclose various systems of alignment marks used on different types of wafers. The Bijnen U.S. Pat. App. Pub. No. 2007/0031743 discloses a lithographic substrate having a plurality of alignment marks which provide features spaced apart at different distances. The Roman U.S. Pat. No. 5,580,831 discloses a method for producing alignment marks on opposing surfaces of a flat surface, such as a semiconductor wafer. In this process, symmetrical cuts and grooves are disposed upon the surface of a wafer. Cuts being made on opposing surfaces of the wafer are slightly offset to lessen the risk of mechanical failure occurring. The Yoo U.S. Pat. Pub. No. 2001/0033033 discloses an alignment mark configuration wherein the alignment mark is protected from subsequent planarization using a plurality of rectangular recesses. The Ouellet U.S. Pat. Pub. No. U.S. 2003/0032299 discloses a method for aligning structures on the first and second sides of a wafer using transparent islets and alignment marks.

The Inoue reference, U.S. Pat. No. 5,182,233 discloses the use of a compound semiconductor pellet wherein the major surface of the pellet and the side surfaces thereof are both 100 planes and an off center aperture is utilized to induce asymmetry into the configuration of the wafer. The Teramoto U.S. Pat. Pub. No. 2003/0102576 discloses an alignment pattern and method of forming the pattern having a sloped surface, an alignment hole, an insulation layer, and an oxide film for the purpose of patterning a metal interconnection film. The Ido U.S. Pat. Pub. No. 2004/0262783 A1 discloses semiconductor devices having alignment marks and imbedded portions on the surface of a wafer. The wafer surface is also provided with a high reflectance portion and a low reflectance portion, and an irregular reflection film arranged internally.

The Berge U.S. Pat. Pub. No. 2005/0118781 discloses a method whereby a plurality of alignment markers are anisotropically etched into the substrate of a wafer in order to determine the orientation of the crystal axis. The Kobayashi U.S. Pat. Pub. No. 2005/0070068 discloses a method of forming an alignment mark on a substrate by removing a portion of material in a grid like etching on the surface of a wafer. The Lin U.S. Pat. No. 5,982,044 discloses an alignment pattern and algorithm for producing the marks, which minimize misalignment due to asymmetric formation of a material layer. The pattern consists of a substantially circular grid and triangular etchings which are photomasked upon the wafer.

The So U.S. Pat. No. 6,261,918 B1 discloses a method of producing alignment marks in an integrated circuit by forming a basic alignment mark, and then creating a second set of marks overlapping the first set of marks which are positioned perpendicular thereto to form a preservation pattern and then further etching to produce a checkerboard type pattern. The wafer then undergoes CMP (Chemical Mechanical Planarization) without damaging the first of marks. The Glenn U.S. Pat. No. 6,869,861 B1 discloses a vertical and horizontal scribe line that aids in backside alignment of the wafer. An aperture may be drilled through the wafer at the intersection of the scribe lines.

The Bijnen disclosure, U.S. Pat. Pub. No. 2007/0031743 discloses the use of a lithographic substrate to provide an alignment mark having a plurality of features spaced apart from one another by varying distances. The Pike U.S. Pat. No. 6,410,927 B1 discloses a semiconductor wafer analysis tool for scanning raw wafers which helps orient and align wafers to a preexisting mark, which aids in the identification of defects prior to further processing of the wafer. The Witvrouw U.S. Pat. No. 6,740,542 B2 discloses a method for producing micromachined devices wherein a crystalline wafer is processed to align it in the direction that a cleavage is likely to occur in order to provide improved resistance to crack propagation. An etching or grid is used in this instance.

Others devices found in prior art have rounded edges, but the primary purpose of such a rounded edge is to prevent chipping rather than to impart asymmetry to a substrate. The Maejima U.S. Pat. No. 4,783,225 discloses a wafer having chamfered bent portions in the joint regions and a semicircular notch, which bent portions prevent chipping of the wafer edge; the wafer is used for creating integrated circuits. The Maejima U.S. Pat. No. 5,230,747 discloses a semiconductor wafer having chamfered bent portions in joint regions and a cutaway portion, such as an orientation flat. Acute bends are formed in the joint parts between the flat portion of the wafer and its contour to prevent chipping away at the joint portion. The Ogino U.S. Pat. No. 5,110,764 discloses a substantially rectangular semiconductor silicon wafer having a beveled portion asymmetrically formed which prevents its circumferential edges from being chipped. Similarly, the Ogino U.S. Pat. No. 5,021,862 discloses an asymmetrical circumferential edge beveled semiconductor wafer which prevents the wafer from being chipped. The Kimura U.S. Pat. No. 5,045,505 discloses a method of processing a semiconductor device by simultaneously forming annular beveled portions on both the front and back of a wafer in order to prevent the edge of the wafer from chipping because the grinding operation is balanced, having equal pressure being applied to both front and back surfaces.

The Maejima U.S. Pat. No. 5,279,992 discloses a wafer having a curved notch along its outer periphery and chamfered portions to prevent chipping of the wafer edge. The Nishi U.S. Pat. No. 6,302,769 B1 discloses a method of chamfering a disk-shaped wafer using a grindstone to first make an angular notch in the edge, and then the grindstone makes a semicircular edge chamfer both in the interior of the notch, and also along the entire perimeter of the wafer. The Asano U.S. Pat. No. 6,897,126 B2 discloses a method of manufacturing a compound semiconductor device which is given a slanted edge to reduce chipping when a wafer is diced along on angle between 30 and 60 degrees with respect to the orientation flat.

Finally, many publications disclose several other ways to alter semiconductor wafers. For example, the Urakami U.S. Pub. No. 2001/0048142 discloses a semiconductor substrate and method for developing a trench in that substrate upon the surface of the wafer. Similarly, the Urakami U.S. Pat. App. Pub. No. 2003/0164534 discloses a semiconductor substrate and method for developing a trench in that substrate. See the related Urakami disclosure, infra. The Fukuda U.S. Pat. App. Pub. No. 2004/0097084 discloses a method for grinding the rear surface of a semiconductor to a flat surface and predetermined thickness. In one embodiment, a sharp knife edge is formed.

The Tomita U.S. Pat. App. Pub. No. 2004/0246795 discloses a method of cutting wafers using a large wafer and a small wafer moving together via means of a pusher plate so that the larger wafer and the smaller wafer may be bonded to one another with their centerlines and orientation flats properly aligned. The Subramonian U.S. Pat. App. Pub. No. 2006/0118920 discloses a method for forming vias that have at least one pair of opposing side walls using potassium hydroxide.

The Arai U.S. Pat. No. 7,183,178 B2 discloses a method of manufacturing a semiconductor wafer wherein a film is formed on the wafer to prevent it from warping during the subsequent grinding steps. The Fournel U.S. Pat. Pub. No.

2003/0175531 discloses a process for controlling the formation of secondary structures on the surface of a crystalline structure. The Arai U.S. Pat. Pub. No. 2005/0106840 discloses a method of forming a semiconductor wafer wherein a film is applied to the back surface to prevent it from warping. See the Arai reference 7,183,178, supra.

The Doris U.S. Pat. Pub. No. 2005/0280121 discloses a hybrid substrate and a method for fabricating such a substrate having a high-mobility surface for use with planar and/or multiple-gate metal oxide semiconductor field effect transistors (MOSFETs). The van den Brekel U.S. Pat. No. 4,000,019 discloses a method of manufacturing a semiconductor device having a pattern of highly doped zones as well as providing an epitaxial silicon layer on one side. The Nishimura U.S. Pat. No. 4,861,418 discloses a method of manufacturing a semiconductor crystalline layer wherein a polycrystalline layer is formed, then an insulating layer is formed, and finally an argonne laser beam scans the layers to form a single crystalline layer on the wafer from the underlying semiconductor crystals which are used as the seeds. The Maruyama U.S. Pat. No. 5,751,055 discloses a semiconductor substrate having a chamfer produced by vapor phase epitaxial growth in order to locate an edge crown. The Bruel U.S. Reissue Pat. No. RE39,484 E discloses a process for the preparation of a semiconductor film.

For certain current substrate applications, the standard methods for marking substrates, and which methods are recommended by industry standards such as SEMI, are not acceptable or desirable. A specific example occurs when sapphire substrates are used in silicon-on-sapphire applications. The tooling used for silicon deposition and resultant wafer handling do not typically accept the number of orientation flats required to visually maintain crystal orientation. A non-standard method must be employed. The inventive asymmetrical wafer configurations and method for making same presented herein consist of rounding at least one corner of a single orientation flat to impart visual and tactile asymmetry and accordingly they constitute a vast improvement over the prior art.

Nowhere in the prior is found a substantially annular wafer having at least one truncated flat whereby at least one corner has been rounded in order to facilitate differentiation between the two sides of the wafer. Also, nothing may be found in the prior art wherein a substantially circular wafer which has a notch having at least one rounded corner wherein the configuration creates visual and tactile asymmetry in order to determine the wafer's crystalline orientation. Because the present inventive configuration of wafers is completely novel in the art, the preferred methods employed to create such new products are likewise novel.

SUMMARY OF THE INVENTION

The crystalline orientation indicators of the prior art are not ideal or compatible with many of the machines and processes used in today's semiconductor industry. Specifically, standard indicators used in sapphire substrates are not always compatible with silicon-on-sapphire applications. The tooling used for silicon deposition and resultant wafer handling do not typically accept the number of orientation flats required to visually maintain crystal orientation. The present invention solves and improves upon the many shortcomings of the prior art by being more effective as a visual and tactile indicator of the wafer's crystalline orientation and it is more compatible with many of the machines and processes used currently in the industry.

One preferred embodiment of the present invention consists of a truncated substantially annular wafer which is provided with a rounded corner on at least one corner of the orientation flat. This rounded corner allows a user to easily determine the crystalline orientation of the wafer by creating an asymmetric visual and tactile indicator. In another preferred embodiment of the present invention, both corners of the flat are rounded, but each corner has been rounded to a substantially different radii. The radii of the two rounded corners are preferably of a deviation that is sufficient enough to be able to create visual and tactile asymmetry in order to adequately indicate crystalline orientation.

According to the present invention, the wafers may consist of any substrate exhibiting different crystallographic orientation, finish and/or semiconducting properties. Such substrates may include, but are not limited to: Sapphire, Silicon, Silicon Oxide, Aluminum Nitride, Germanium, Silicon Carbide, Gallium Arsenide, Gallium Phosphide, Gallium Nitride, or their crystalline and amorphous analogs. Other commercially valuable single crystal substrates are made from Lithium Niobate, Lithium Tantalate, or from materials chosen from any of the II-VI compound semiconductor family.

Sapphire wafers, in particular, are used to produce LED's, or light emitting diodes, laser diodes, high power and high frequency electronic devices and integrated circuits, photovoltaic devices, as well as sensors. A common practice utilized to indicate crystalline orientation in the industry is the use of secondary flats on one side of the wafers or the polishing of one side of the wafer. These common practices for determining sapphire flat orientation have not been ideal due to the specific nature of sapphire and its machinery and tooling. Secondary flats also may significantly reduce the amount of usable surface area and thus waste expensive sapphire material. The present invention solves this problem by necessitating the use of only one orientation flat, while at the same time allowing the user to identify the crystalline orientation by visual or tactile asymmetry by providing at least one rounded corner on the flat.

In another preferred embodiment of the present invention, the wafer's crystalline orientation may be indicated by providing a small notch instead of a flat for wafers having larger diameters. Typically, for wafers of diameters of 200 mm or larger, a flat may not be used because such flats would not be compatible with many of the machines and tools currently used on such larger wafers. Also, such flats greatly reduce the amount of usable surface area, hence wasting significant substrate material. Thus, a small notch would be preferable or wafers of such large size. Similar to the orientation flat configuration described above, the small notch would indicate crystalline orientation by rounding the two corners of the notch with differential radii or by rounding at least one corner to impart visual and or tactile asymmetry. These orientation notches may consist of many types of geometric configurations. Such geometric configurations may consist of, but are not limited to: angular, square, trapezoidal, pie shaped, semi-spherical, elliptical, parabolic, circular or oval.

Additionally, to impart further information, such as whether the crystalline wafer is p-type or n-type, the present inventive wafer design may be provided with a secondary flat or notch on the wafer, with each flat or notch having either two rounded corners each, or one rounded corner, or rounded corners of a different radii in order to represent additional information other than crystalline orientation.

The present invention also includes a method of creating an annular wafer having at least one rounded corner on an orientation flat. To produce the wafers, initially single crystal ingots are grown by utilizing commercial processes. Next, the grown crystal ingots undergo x-ray measurements to determine their crystalline orientation, after which one side of the crystal ingots are ground down to create the orientation flat or notch before they are sliced into wafer blanks. Finally, wafers' surfaces and edges are ground, polished, cleaned, and sent on to final metrology. During this process, the corners of the orientation flat are made asymmetric either by being rounded when the flat is created, or when grinding occurs during one of the final phases. When the corners of the orientation flat are rounded, they are preferably rounded via a standard method so that crystals with the same orientation always contain the rounded corner on the same side. To implement the process, commercially available surface and edge grinding tools common in the machining and semiconductor industries would be utilized.

The present invention also includes a method of creating a substantially circular wafer having at least one rounded corner on an orientation notch. The wafers are produced in the same manner as a wafer containing an orientation flat, but instead of grinding an orientation flat into the crystal ingots, an orientation notch would be ground therein. During this process, the corners of the orientation notch are made visually asymmetric by being rounded at either an intermediate step when the notch is created, or during a final grinding phase. When the corners of the orientation notch are rounded, they preferably are rounded in a standard way so that crystal of the same orientation always have the rounded corner on the same side. Again, in order to implement the process, commercially available surface and edge grinding tools common in the machining and semiconductor industries would be utilized.

OBJECTS OF THE INVENTION

Thus, it is one primary object of the present invention to provide a substantially annular wafer whereby one may readily differentiate its opposing sides of the wafer by identifying at least one rounded corner on one side of an orientation flat, either visually or tactilely.

It is yet another primary object of the present invention to provide a substantially annular wafer whereby one may readily differentiate its opposing sides by rounding at least one single corner of an orientation notch.

Another primary object of the present invention to provide a method of making wafers which contain at least one rounded corner on an orientation flat from a single crystal ingot.

It is yet another primary object of the present invention to provide a method of making wafers which contain a rounded corner of a notch from a single crystal ingot.

It is yet another primary object of the present invention to provide an improved method for readily identifying the orientation of semiconductor wafers, sapphire wafers, or any other type of wafer or disc that has an underlying molecular, crystalline or other structural asymmetry which is not readily apparent from visual inspection.

Another primary object of the present invention is to provide substantially circular wafers having a notch of substantially angular configuration with at least one rounded corner in order to indicate crystalline orientation by visual or tactile asymmetry.

It is a further primary object of the present invention to provide an annular wafer having a flat with two rounded corners, whereby each rounded corner has substantially differing radii such that it is possible to create visual and tactile asymmetry for readily indicating crystalline orientation.

It is yet another primary object of the present invention to provide a substantially circular wafer having a notch with two rounded corners, wherein each corner has been rounded with sufficiently differing radii in order to impart visual and tactile asymmetry for the purpose of determining crystalline orientation.

Another primary object of the present invention is to provide a method of making wafers having two rounded corners on an orientation flat from a cylindrical ingot wherein each corner has been rounded with sufficiently differing radii such that they impart visual and tactile asymmetry for the purpose of indicating crystalline orientation.

It is yet another primary object of the present invention to provide a method of making wafers having two rounded corners created on a notch from a cylindrical ingot, wherein each rounded corner has substantially differentiating radii such that visual and tactile asymmetry may be created in order to indicate crystalline orientation.

These and other objects and advantages of the present invention can be readily derived from the following detailed description of the drawings taken in conjunction with the accompanying drawings present herein and should be considered as within the overall scope of the invention.

BRIEF DESCRIPTION OF THE DRAWINGS

FIG. 1 is a side perspective view of a wafer expanded to show the front and backside of the wafer.

FIG. 2 is an elevated top view of the wafer with a close up insert view of the asymmetric corners.

FIG. 11 is a flow chart of the process of producing a wafer with an orientation notch with at least one rounded corner.

FIG. 12 is a flow chart of the process of producing a wafer with an orientation notch with both corners rounded with differing radii.

DETAILED DESCRIPTION OF THE DRAWINGS

Figure 3:
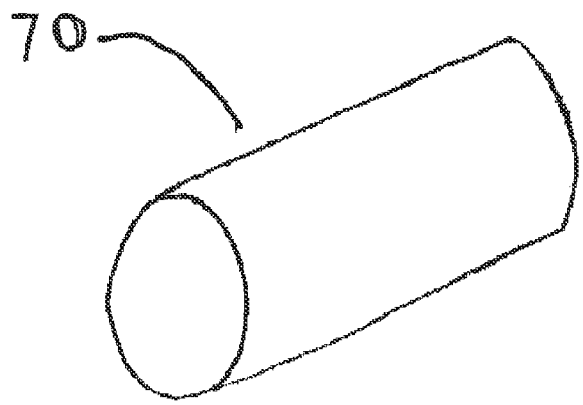
FIG. 3 is an ingot in side perspective view undergoing x-ray analysis to determine orientation.

One preferred embodiment of the present invention shown in FIG. 1 is substantially annular wafer 10 which has been provided with orientation flat 40. The annular wafer 10 is preferably made from substrates of the semiconductor compound groups that exhibit different crystallographic or finishing properties. Such substrates may include, but are not limited to: Sapphire, Silicon, Silicon Oxide, Aluminum Nitride, Germanium, Silicon Carbide, Gallium Arsenide, Gallium Phosphide, Gallium Nitride, or their crystalline and amorphous analogs. Substrates having other commercially valuable single crystal substrates are made from: Lithium Niobate, Lithium Tantalate, or from the any of the II-VI compound semiconductor family.

Preferably, annular wafer 10 and orientation flat 40, would be utilized in conjunction with smaller wafers having a diameter of four inches or less. On wafers of larger sizes, from 200 mm and larger diameters, an orientation flat would not generally be utilized inasmuch as it may greatly reduce the amount of usable surface area, hence unnecessarily wasting valuable substrate material. The annular wafer 10 would be cut to a standard thickness commonly utilized within the semiconductor industry.

Annular wafer 10, in FIG. 1, contains one orientation flat 40. FIG. 1 also shows an expanded view of the backside 20 and frontside 30 of annular wafer 10. On the backside 20 the A-axis is shown running from the top right to the bottom left, and the C-axis projection is perpendicular to this axis. Orientation flat 40 is shown at the bottom of the backside 20. On the frontside 30, the A-axis is shown running from the top left to the bottom right, and the C-axis is perpendicular to it. Orientation flat 40 is shown on the bottom. This figure illustrates that backside 20 and frontside 30, while different, appear identical from visual examination.

FIG. 2 shows frontside 30 of annular wafer 10 which has been provided with orientation flat 40. Orientation flat 40 contains two corners: sharp corner 50 and rounded corner 60. These different corner configurations which are provided orientation flat 40 impart visual and tactile asymmetry to the wafer 10. From this inherent symmetry, a user, by either feeling for the rounded corner 60 which differs from the feel of sharp corner 50 or by visually identifying the features, may thereby determine at least one aspect of the molecular structure of the wafer.

Annular wafer 10 would be typically produced by common techniques well known in the semiconductor industry. FIG. 3 shows an initial step wherein single crystal ingot 70 is grown according to common industry methods. The single crystal ingot 70 is substantially cylindrical and would be grown to size of preferably eight to twelve inches length. After it as been grown, the crystalline orientation is determined by standard industry methods such as X-ray analysis. After the crystal orientation of the ingot 70 has been determined, it will then typically enter into the shaping phase.

Figure 4:
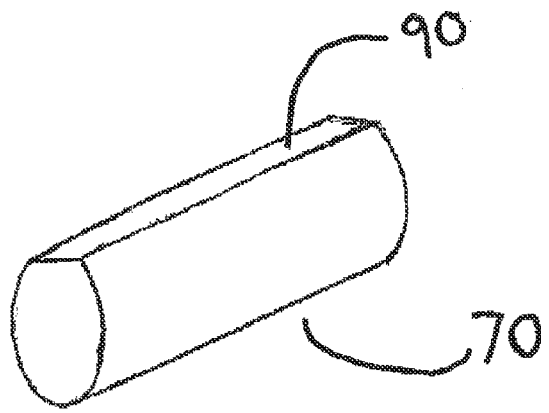
FIG. 4 is a side perspective view of an ingot which has had an orientation flat ground into it.
Figure 5:
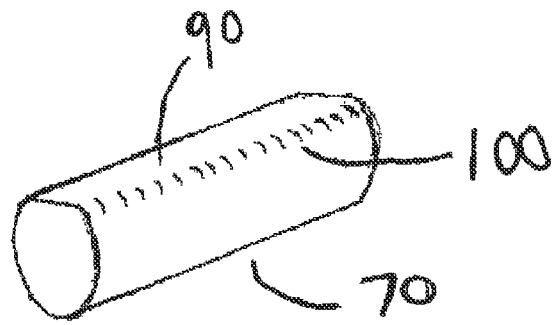
FIG. 5 is a side perspective view of an ingot with a flat where one corner of the flat has been ground down.

During the shaping phase, an orientation plane 90 is ground upon the cylindrical crystal ingot 70. FIG. 4, illustrates the crystal ingot 70 having an orientation plane 90. After orientation plane 90 had been ground into the crystal ingot 70, preferably at least one corner of the crystal ingot 70 then would be rounded. FIG. 5 shows the crystal ingot 70 having orientation plane 90 that has been provided with at least one rounded corner 100.

Figure 6:
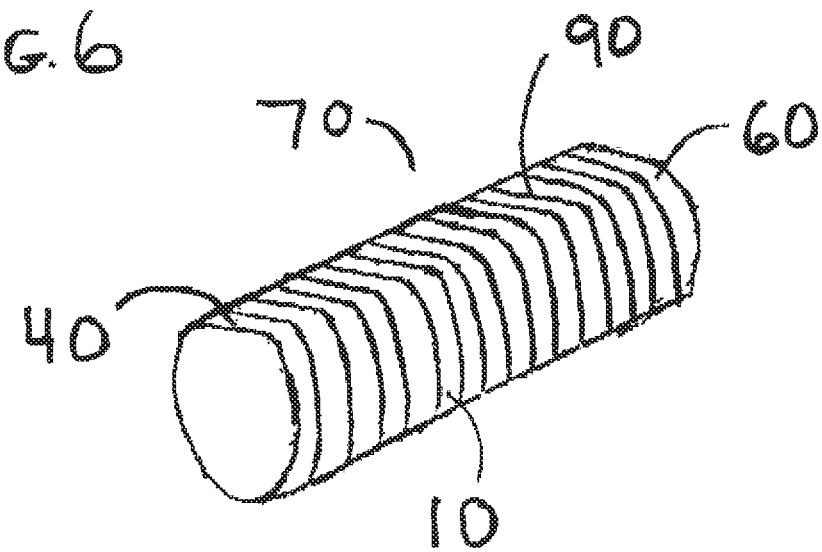
FIG. 6 is a side perspective view of the ingot cut into slices.

After the crystal ingot 70 had been shaped with an orientation plane 90 and at least one rounded corner, the crystal ingot 70 is sliced into wafers 10. FIG. 6 shows the crystal ingot 70 having orientation plane 90 and rounded corner 100 sliced into wafers 10, each of which have an orientation flat 40 and a rounded corner 60 to identify the orientation of the wafer 10. The wafers 10 are preferably sliced to a standard industry thicknesses by machinery used in the semiconductor industry.

Figure 7:
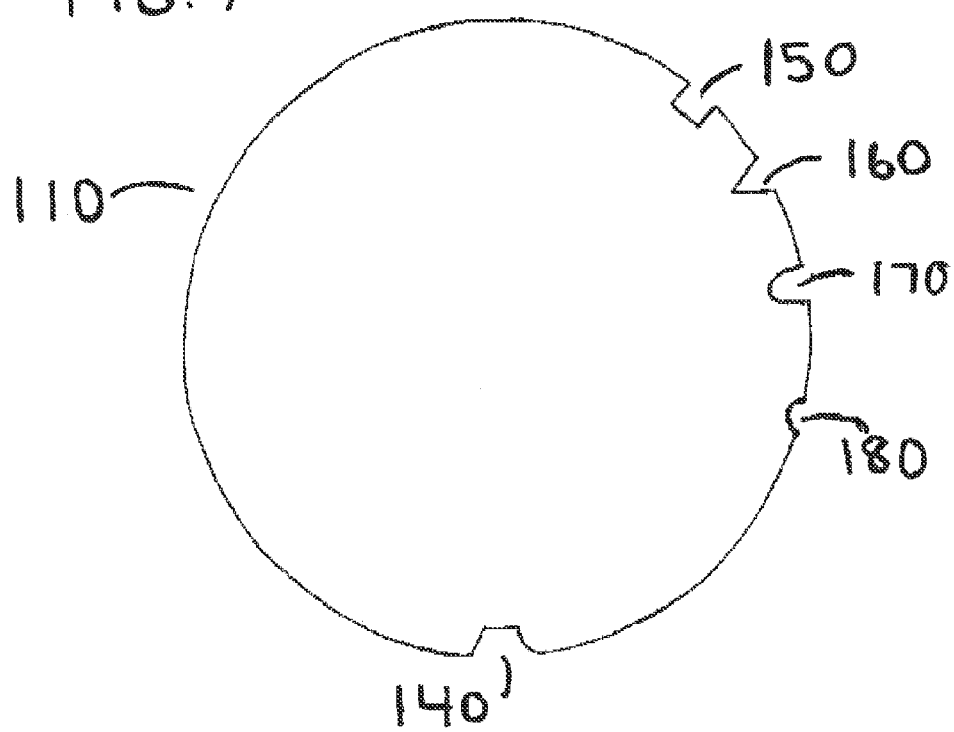
FIG. 7 is a top elevation view of a wafer with a notch.

FIG. 7 illustrates another preferred embodiment of the present invention consisting of a substantially circular wafer 110 having orientation trapezoidal notch 140, orientation square notch 150, orientation triangular notch 160, orientation elliptical notch 170, and an orientation circular notch 180. The substantial circular wafer 110 is preferably 100 mm or larger since the orientation notches 140, 150, 160, 170, and 180 are more ideal on larger wafers because they may conserve larger amounts of usable surface area. The substantially circular wafers 110 are preferably produced by the same method as the annular wafers 10, but during the shaping phase, at least one of the notches 140, 150, 160, 170, and 180, would be ground into the single crystal ingot instead of the orientation plane 90 illustrated in FIG. 4. Although a plurality of differing shapes of orientation notches are shown herein: trapezoidal 140, square 150, triangular 160, elliptical 170, and circular 180, one or more of these notches may be utilized to convey orientation or other desired information to the user of the wafer.

Figure 8:
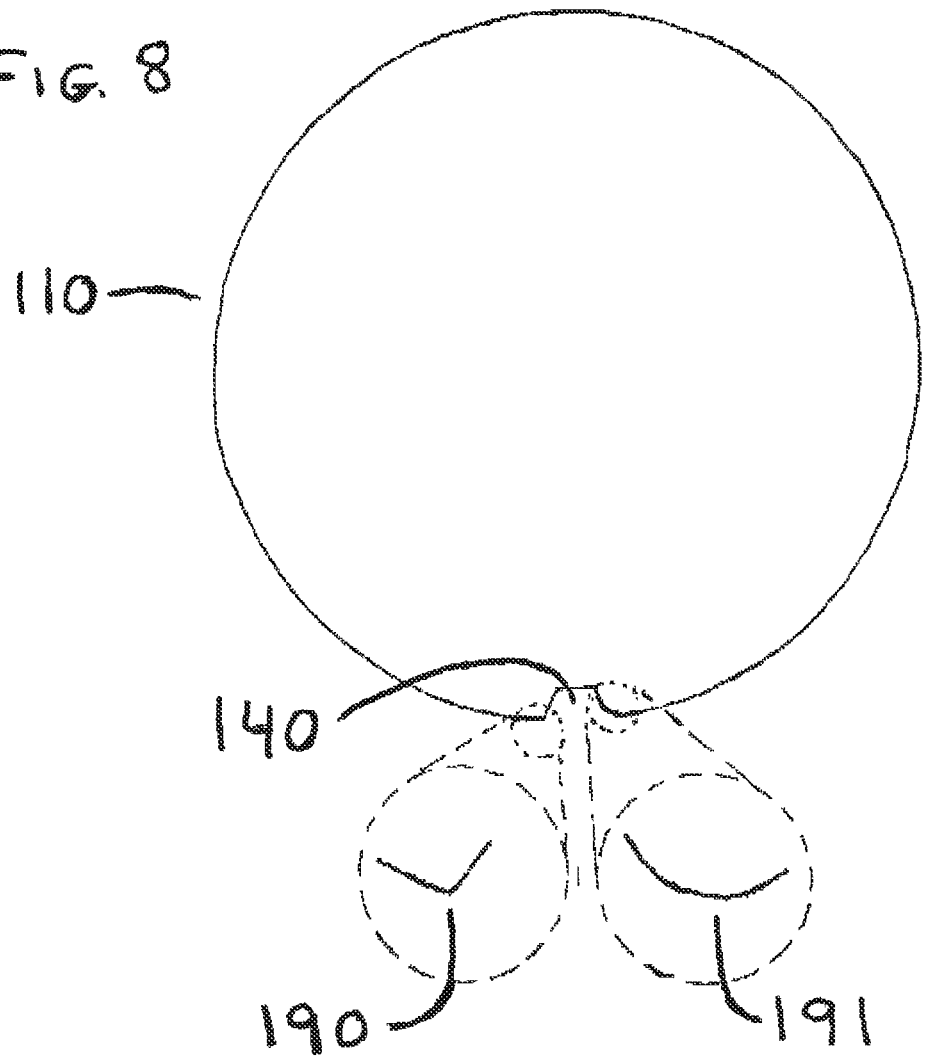
FIG. 8 is a top elevation view of the wafer with expanded insert views of an asymmetrical notch.

FIG. 8 shows substantially circular wafer 110 having orientation trapezoidal notch 140, whereby the notch 140 has been provided with one sharp corner 190 and one rounded corner 191, which features readily impart both visual and tactile asymmetry to wafer 110. From this inherent asymmetry, a user, by either feeling for the rounded corner 191 which differs from the feel of sharp corner 190 or by visually identifying the features, may thereby determine at least one aspect of the molecular structure of the wafer.

Figure 9:
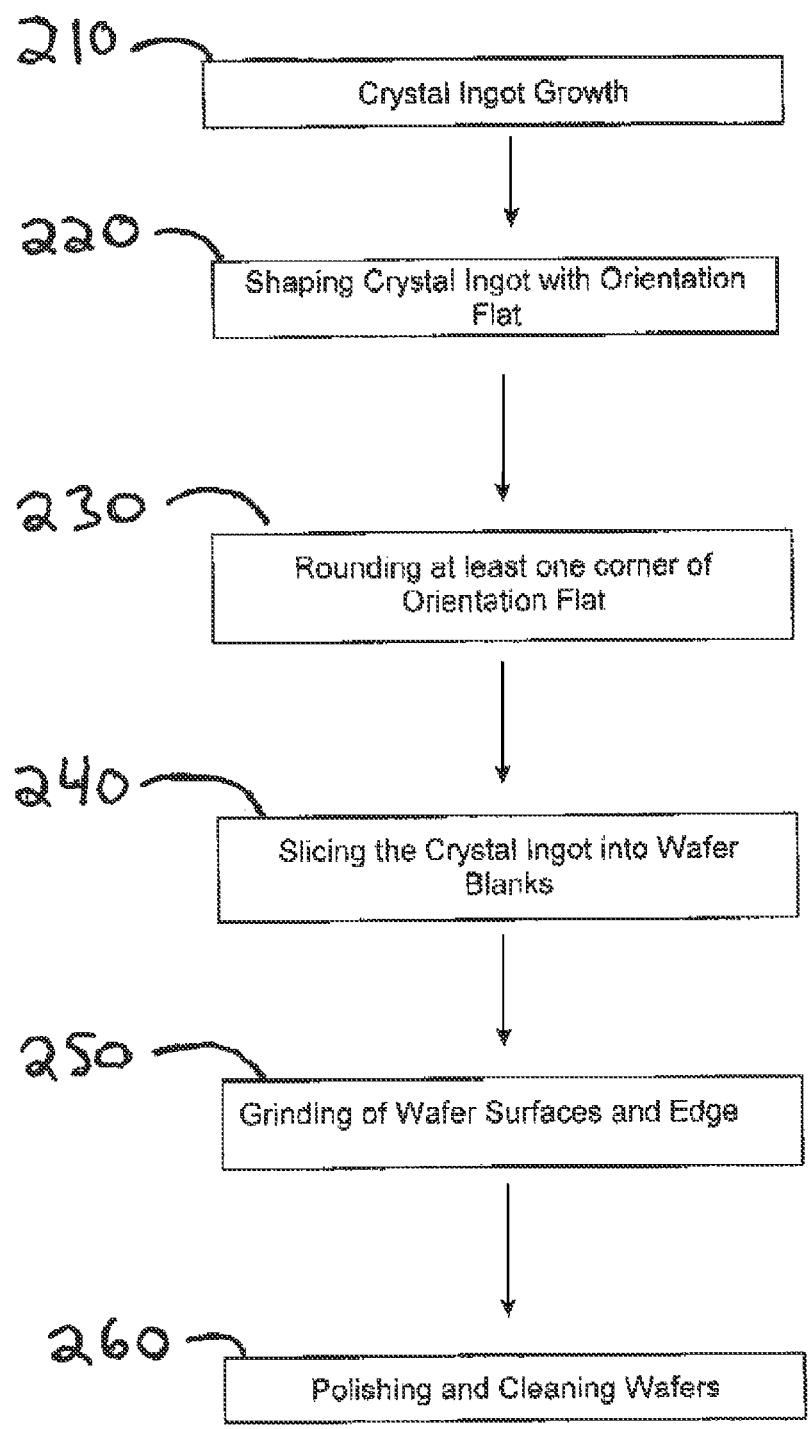
FIG. 9 is a flow chart of the process of producing a wafer with a flat with at least one rounded corner.

FIG. 9 shows a representative flow chart detailing one preferred method of producing asymmetrical wafers in accordance with the present invention. An initial step is taken by providing a cylindrical crystal ingot growth 210 where the crystal ingot has been grown according to common industry methods. After the crystal ingot has been created, its crystalline orientation will then be determined by a common industry method such as an x-ray crystallography technique. After the crystalline orientation has been determined, the next step may comprise a shaping phase 220 wherein the crystal ingot may be ground to create orientation flat. One succeeding step may consist of rounding at least one corner 230 of the wafer. The next step may consist of slicing 240 the crystal ingot into wafers. The wafer may be further processed by grinding 250 the wafer surfaces and edges. One type of final process may consist polishing and cleaning 260 the wafers.

Figure 10:
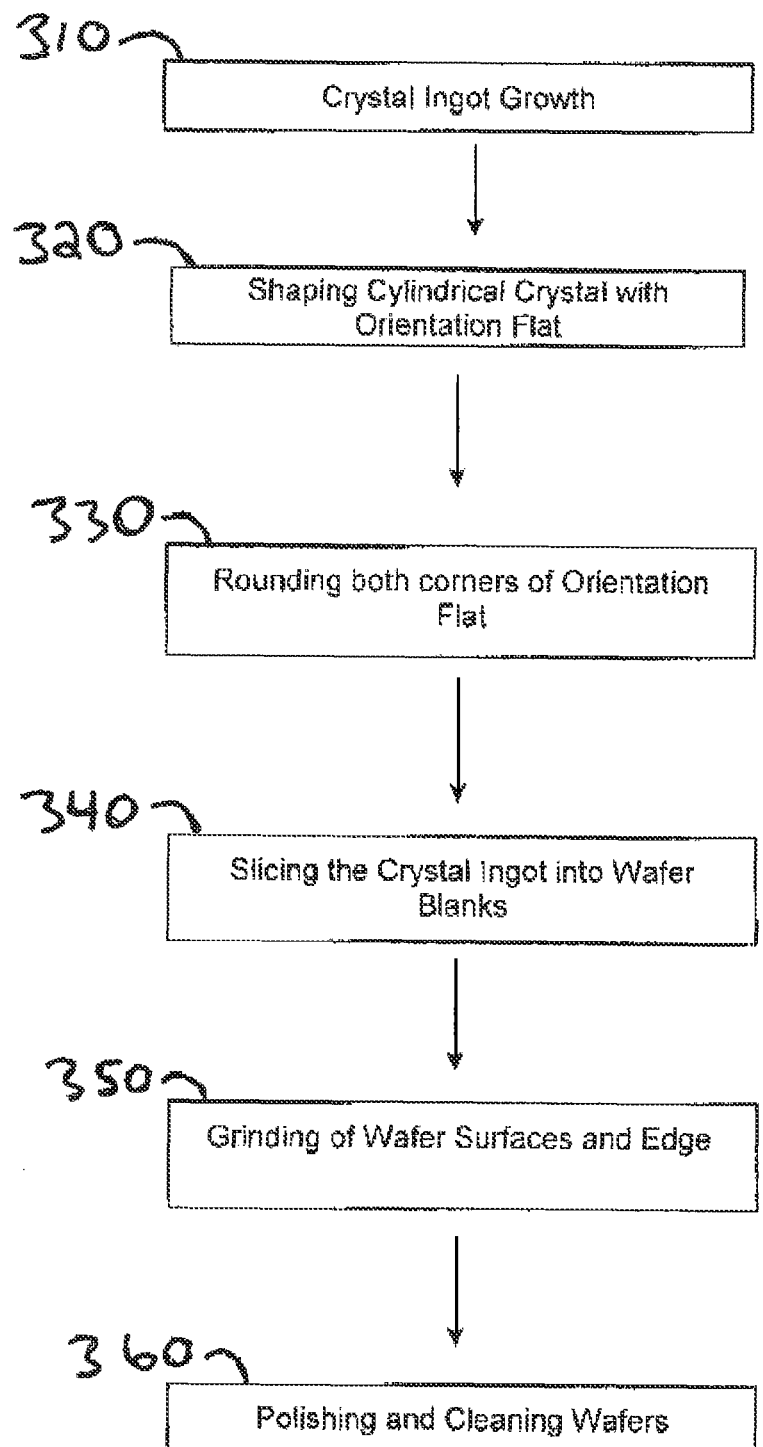
FIG. 10 is a flow chart of the process of producing a wafer with a flat with both corners rounded with differing radii.

FIG. 10 shows a representative flow chart detailing another preferred method of producing an annular wafer having an orientation flat and a pair of asymmetrically rounded corners. An initial step may consist of creating a cylindrical crystal ingot growth 310 wherein a crystal ingot is grown according to common industry methods. After the crystal ingot has been grown, its crystalline orientation may then be determined by a common industry method such as an x-ray crystallography technique and the like. After the crystalline orientation has been determined, a subsequent processing step may consist of a shaping phase 320 wherein the crystal ingot may be grounded to create at least one orientation flat. A subsequent step may consist of rounding 330 both corners with substantially differing radii. The radii of the rounded corners preferably vary sufficiently from each other in order to display visual asymmetry for readily determining the wafer's interior crystalline orientation. A subsequent processing step may consist of slicing 340 the crystal ingot into waters, after which a further processing step may consist of grinding 350 the wafer's surfaces and edges. A final processing step may consist polishing and cleaning 360 the wafers.

FIG. 11 shows a representative flow chart detailing yet another preferred embodiment of the present invention, a method for producing a substantially circular wafer having at least one orientation notch. An initial step may consist of creating a cylindrical crystal ingot growth 410 wherein the crystal ingot is grown according to common industry methods. After the crystal ingot has been grown, its crystalline orientation may then be determined by a common industry method such as an x-ray crystallography technique. After the crystalline orientation has been determined, a subsequent processing step may consist of a shaping phase 420 wherein the crystal ingot may be ground to create at least one orientation notch. Preferably, the at least one orientation notch may consist of many different types of geometric configurations.

Such geometric configurations may include, but are not limited to: angular, trapezoidal, square, triangular, semi-spherical, elliptical, circular or oval. A subsequent step may consist of rounding at least one corner 430 of at least one orientation notch. A further step may consist of slicing 440 the crystal ingot into wafers and then grinding 450 the wafer surfaces and edges. A final processing step may consist of polishing and cleaning 460 the wafers.

FIG. 12 shows a representative flow chart detailing yet another preferred method of the present inventive method for producing a substantially circular wafer having at least one orientation notch and two rounded corners. An initial step may consist of creating a cylindrical crystal ingot growth 510 wherein a crystal ingot is grown according to common industry methods. After the crystal ingot has been grown, its crystalline orientation may be determined according to common industry methods such as an x-ray crystallography technique. After the crystalline orientation has been determined, a subsequent step may consist of a shaping phase 520 wherein the crystal ingot is ground in order to create at least one orientation notch. A subsequent processing step may consist of rounding 530 both corners of the at least one orientation notch with substantially differing radii. The radii of the rounded corners preferably vary from each other sufficiently in order to display visual and tactile asymmetry so that the user may be able to readily determine the interior or molecular crystalline orientation. A subsequent step may consist of slicing 540 the crystal ingot into wafers and grinding 550 the surfaces and edges of each wafer. A final processing step may consist of polishing and cleaning 560 the individual wafers.

Although in the foregoing detailed description the present invention has been described by reference to various specific embodiments, it is to be understood that modifications and alterations in the structure and arrangement of those embodiments other than those specifically set forth herein may be achieved by those skilled in the art and that such modifications and alterations are to be considered as within the overall scope of this invention.

What is claimed is:

1. A method of making a plurality of wafers, comprising the steps of:
   determining crystalline orientation of a substantially cylindrical crystal ingot;
   shaping at least one orientation flat upon said substantially cylindrical-crystal ingot;
   rounding at least one corner of said orientation flat to create a visual asymmetry to identify the determined crystalline orientation; and
   slicing said substantially cylindrical crystal ingot into a plurality of wafers, each of the plurality of wafers having at least one rounded corner.

2. The method in claim 1, further comprising:
   growing the substantially cylindrical crystal ingot.

3. The method in claim 2, further comprising the steps of:
   grinding at least one surface and edge of each of said plurality of wafers; and
   polishing and cleaning said plurality of wafers.

4. The method of claim 1, wherein said step of rounding at least one corner of said orientation flat further comprises rounding two corners of said orientation flat to differing radii to be visually asymmetric with respect to one another.

5. The method of claim 1, further comprising:
   grinding at least one truncated flat upon said substantially cylindrical crystal ingot; and
   grinding a secondary truncated flat upon said substantially cylindrical crystal ingot.

6. The method of claim 5, further comprising rounding at least one corner of the secondary truncated flat that is visually asymmetric to an opposing corner.

7. A method of making at least one substantially circular wafer, comprising the steps of:
   determining crystalline orientation of a substantially cylindrical crystal ingot;
   shaping at least one notch upon said substantially cylindrical crystal ingot; and
   rounding two corners of said at least one notch to differing radii in order to be visually asymmetric to each other.

8. The method of claim 7, further comprising the steps of:
   growing the substantially cylindrical crystal ingot; and
   slicing said substantially cylindrical crystal ingot into a plurality of substantially circular wafers.

9. The method in claim 8, wherein said method of making a substantially circular wafer further comprises the steps of:
   grinding at least one surface and edge of each of said plurality of substantially circular wafers; and
   polishing and cleaning each of said plurality of substantially circular wafers.

10. The method of claim 7, wherein said step of shaping at least one notch upon said substantially cylindrical crystal ingot further comprises shaping a secondary notch upon said substantially cylindrical crystal ingot.

11. The method of claim 10, further comprising rounding at least one corner of the secondary notch in order to create visual asymmetry with respect to opposing corner of the secondary notch.

* * * * *